(12) United States Patent
Mutsuji et al.

(10) Patent No.: US 10,026,639 B2
(45) Date of Patent: Jul. 17, 2018

(54) SEMICONDUCTOR WAFER CONVEYING TOOL

(71) Applicant: Senju Metal Industry Co., Ltd., Tokyo (JP)

(72) Inventors: Toshihiko Mutsuji, Saitama-ken (JP); Kaname Nagata, Tokyo (JP)

(73) Assignee: Senju Metal Industry Co., Ltd., Tokyo (JP)

(*) Notice: Subject to any disclaimer, the term of this patent is extended or adjusted under 35 U.S.C. 154(b) by 0 days.

(21) Appl. No.: 14/416,532

(22) PCT Filed: Jul. 25, 2013

(86) PCT No.: PCT/JP2013/070181
§ 371 (c)(1),
(2) Date: Jan. 22, 2015

(87) PCT Pub. No.: WO2014/017587
PCT Pub. Date: Jan. 30, 2014

(65) Prior Publication Data
US 2015/0179496 A1    Jun. 25, 2015

(30) Foreign Application Priority Data
Jul. 26, 2012 (JP) ................................ 2012-165817

(51) Int. Cl.
*H01L 21/687* (2006.01)
*H01L 21/673* (2006.01)

(52) U.S. Cl.
CPC .... *H01L 21/6875* (2013.01); *H01L 21/67346* (2013.01); *H01L 21/68707* (2013.01)

(58) Field of Classification Search
CPC ........... H01L 21/6875; H01L 21/68735; H01L 21/68742
See application file for complete search history.

(56) References Cited

U.S. PATENT DOCUMENTS 5,980,195 A * 11/1999 Miyashita ........... H01L 21/6732
    414/783
6,062,852 A *  5/2000 Kawamoto ....... H01L 21/67109
    392/418
(Continued)

FOREIGN PATENT DOCUMENTS

EP    0357424 A2    3/1990
EP    1610374 A1   12/2005
(Continued)

OTHER PUBLICATIONS

Korean Intellectual Property Office, Notice of Preliminary Rejection for corresponding Korean Patent Application No. KR-10-2015-7001629, dated Jul. 20, 2015, pp. 10, including English translation.
(Continued)

*Primary Examiner* — Steven B McAllister
*Assistant Examiner* — Steven Anderson, II
(74) *Attorney, Agent, or Firm* — Chernoff, Vilhauer, McClung & Stenzel, LLP

(57) ABSTRACT

The semiconductor wafer conveying tool which can realize the uniform heating to a surface of a semiconductor wafer when heating the semiconductor wafer is a semiconductor wafer conveying tool which holds the semiconductor wafer having a predetermined diameter to convey it wherein the tool is provided with a main body having an opening with a diameter which is larger than a diameter of the semiconductor wafer, and at least three supporting members each having a predetermined length, containing plural pins which are arranged corresponding to the diameter of the semiconductor wafer and being configured to be a holding mechanism for holding the semiconductor wafer concentrically at a projection position from an inner periphery portion of the main body around the opening, as shown in FIG. 1.

3 Claims, 8 Drawing Sheets

(56) References Cited

U.S. PATENT DOCUMENTS

| | | | |
|---|---|---|---|
| 6,217,663 B1 | 4/2001 | Inokuchi et al. | |
| 6,462,411 B1 | 10/2002 | Watanabe et al. | |
| 6,474,987 B1 | 11/2002 | Nakai et al. | |
| 2008/0189975 A1* | 8/2008 | Miya | H01L 21/68728 34/317 |
| 2009/0133722 A1* | 5/2009 | Koh | B08B 1/04 134/63 |
| 2009/0165721 A1* | 7/2009 | Pitney | C23C 16/4583 118/728 |
| 2010/0330776 A1* | 12/2010 | Zuniga | H01L 21/67092 438/455 |
| 2014/0116847 A1* | 5/2014 | Mutsuji | H01L 21/68728 198/468.3 |

FOREIGN PATENT DOCUMENTS

| | | | |
|---|---|---|---|
| JP | S62-26037 | | 2/1987 |
| JP | H1-130540 | | 9/1989 |
| JP | 5-182891 A | | 7/1993 |
| JP | 05182891 A | * | 7/1993 |
| JP | 6-151550 A | | 5/1994 |
| JP | 2004-158625 A | | 6/2004 |
| JP | 2005129575 A | | 5/2005 |
| JP | 4061904 B2 | | 1/2008 |
| JP | 2009-253115 A | | 10/2009 |
| JP | 2009-272362 A | | 11/2009 |
| KR | 20010028021 A | | 4/2001 |
| KR | 20090011424 A | | 2/2009 |
| WO | 01/18856 A1 | | 3/2001 |

OTHER PUBLICATIONS

Supplementary European Search Report issued by the European Patent Office for EP 13823405, dated Feb. 8, 2016, 4 pages.
Written Opinion from from corresponding International Application No. PCT/JP2013/070181, dated Aug. 22, 2013, 5 pgs., in Japanese language.
International Preliminary Report on Patentability with Article 34 Amendments from corresponding International Application No. PCT/JP2013/070181, date of completion of report: Jun. 30, 2014, 20 pgs., in Japanese language.
English translation of International Preliminary Report on Patentability from corresponding International Application No. PCT/JP2013/070181, date of completion of report: Jun. 30, 2014, 4 pgs.
Decision to Grant a Patent from corresponding Japanese patent application No. 2014-526998, dated Mar. 24, 2015, 6 pgs., including English translation.
English translation of search report from corresponding PCT application No. PCT/JP2013/070181, dated Sep. 3, 2014, 2 pgs.
European Patent Office; Examination Report for European Application No. 13823405.9 dated Oct. 25, 2017; 6 pages.

* cited by examiner

US 10,026,639 B2

SEMICONDUCTOR WAFER CONVEYING TOOL

TECHNICAL FIELD

The present invention relates to a semiconductor wafer conveying tool which is used for conveying a semiconductor wafer in a semiconductor manufacturing process. It particularly relates to the semiconductor wafer conveying tool which enables a semiconductor wafer to be uniformly heated when heating the same.

BACKGROUND

An exclusive conveying tool has been used in the past on a heat treatment process of the semiconductor wafer or on the conveying line thereof in the semiconductor manufacturing process, in order to transfer and/or convey a plurality of semiconductor wafers.

There are different cases about a size of an individual semiconductor wafer to be conveyed. Accordingly, in order to omit a step of changing the conveying tool for each time when the size of the semiconductor wafer to be conveyed is changed, a conveying tool that can cope with the conveyance of the wafers with plural sizes by one species of the conveying tool has been known (see Patent Documents 1 and 2).

In the Patent Document 1, a wafer fork has been disclosed in which holding pins are fixed into their corresponding fixing holes according to a magnitude of a diameter of the semiconductor wafer to be conveyed so as to be able to cope with the conveyance of the wafers with plural sizes. Further, in the Patent Document 2, a wafer-holding table that can cope with the conveyance of the wafers with plural sizes has been disclosed. According to this wafer-holding table, a semiconductor wafer W is conveyed by conveying beams which move vertically and horizontally by a vertical cylinder and a horizontal cylinder. This is so-called "a wafer-holding table of walking beam system". In connection therewith, there are at least three species of heights in the pins for supporting the wafer; the pins each having the same height, are arranged around the same circumference; and the respective pins are concentrically arranged so that the outer ones become taller in an order of heights thereof. It is configured that the wafer supported by the pins each having a height corresponding to a dimension of the wafer is positioned by contacting it with next higher pins.

As another example of the wafer conveyance in which it is possible to cope with the conveyance of the wafers with plural sizes, the example as shown in FIG. 5 is illustrated. In a wafer conveying tool 200 shown in FIG. 5, a base plate 10 and conveying guides 11 are tightened by bolts 14 and the like. An opening 15 having an outer diameter that is smaller than a diameter of a wafer W3 (or W4) is present at a center of the base plate 10. Pins 16A through 16C and 18A through 18C for supporting the wafer W3 (or W4) from below and guides 17A through 17C and 19A through 19C for preventing misalignment of the wafer W3 (or W4) are concentrically arranged on the base plate 10. Three guides 17A through 17C and three 19A through 19C are respectively provided for the wafer W3 (and W4) and the wafer conveying tool 200 conveyed by a conveying device, not shown, along an arrow direction.

DOCUMENT FOR PRIOR ART

Patent Documents

Patent Document 1: Japanese Patent Application Publication No. H06-151550

Patent Document 2: Japanese Utility Model Application Publication No. S62-26037

SUMMARY OF THE INVENTION

Problem to be Solved by the Invention

However, there are the following problems in the wafer fork disclosed in the Patent Document 1, the wafer-holding table disclosed in the Patent document 2 and the conventional wafer conveying tool shown in FIG. 5. When heating the wafer, any heat of the part of a surface of the wafer overlapping with the wafer fork, the wafer-holding table or the conventional wafer conveying tool is transferred to the wafer fork, the wafer-holding table or the conveying tool. As a result thereof, it is feared that heat transfer thereto deteriorates as compared with that of the other part of the wafer which does not overlap with the wafer fork, the wafer-holding table or the conveying tool.

When the heat transfer to the semiconductor wafer deteriorates, a part of the surface of the wafer in which the temperature is lower than the other part thereof in a temperature distribution thereof, namely, a low temperature part occurs so that any extra thermal dose to the semiconductor wafer is required. Accordingly, energy efficiency deteriorates and it is heated so that the low temperature part thereof reaches to a necessary temperature, which results in rupture of the excessively heated part thereof other than the low temperature part and causes an excess costs and/or any failure.

Means for Solving the Problems

In order to solve the above-mentioned problem, the semiconductor wafer conveying tool claimed in claim 1 is a semiconductor wafer conveying tool which can hold a semiconductor wafer having a predetermined diameter to convey it when heating the semiconductor, characterized in that the tool is provided with a main body having an opening with a diameter which is larger than a diameter of the semiconductor wafer, and at least three supporting members each having a predetermined length, containing plural pins which are arranged corresponding to the diameter of the semiconductor wafer and are different in their heights and being installed into the main body, wherein the supporting member constitutes a holding mechanism for holding the semiconductor wafer concentrically by the pins at a projection position from an inner periphery portion of the main body around the opening. According to the semiconductor wafer conveying tool claimed in claim 1, since the opening provided in the conveying tool is larger than the diameter of the semiconductor wafer, the wafer is not overlapped with the main body of the conveying tool.

The semiconductor wafer conveying tool claimed in claim 2 is, in the claim 1, a semiconductor wafer conveying tool wherein one guide or more for preventing misalignment of the wafer are concentrically arranged for each pin, the guide being taller than the pin.

The semiconductor wafer conveying tool claimed in claim 2 is characterized in that the pins have at least two species of heights, the pins having the same height are arranged around the same circumference and the pins are concentrically arranged so that their heights become taller in order from a center of the opening of the main body to an outside thereof.

The semiconductor wafer conveying tool claimed in claim 1 is characterized in that the holding mechanism includes a supporting plate which is arranged radially from the center of the opening, a holding pin for holding the semiconductor wafer from below on the supporting plate, and a guide for preventing misalignment of the wafer, the guide being taller than the holding pin and being arranged outer than the holding pin on the supporting plate.

The semiconductor wafer conveying tool claimed in claim 1 is characterized in that at least three of the supporting plates are radially arranged from the center of the opening.

Effect of the Invention

The semiconductor wafer conveying tool according to the invention is provided with at least three supporting members on the main body having the opening with the diameter that is larger than the diameter of the semiconductor wafer and the supporting member constitutes the holding mechanism for holding the semiconductor wafer concentrically by the pins having the different heights at a projection position from an inner periphery portion of the main body around the opening. Therefore, when heating it, no heat is transferred to the main body of the wafer conveying tool so that it is possible to heat the whole of the wafer uniformly. This allows any costs reduction based on the prevention of surplus power consumption and enables the generation of any failure because of the overheating to be prevented.

Further, by arranging the guide for preventing misalignment of the wafer and the pin for holding the semiconductor wafer in a set, it is possible to prevent the misalignment of the wafer during the conveyance thereof, and it is possible to prevent the wafer from being heated ununiformly.

Additionally, the holding pins have at least two species of heights, those having the same height are arranged around the same circumference and they are concentrically arranged so that their heights become taller in order from the center of the conveying tool to an outside thereof. Thus, it is possible to convey plural species of the wafers by one conveying tool, which enables any conventional change step of the conveying tool to be omitted and any work load to be considerably decreased.

MODES FOR IMPLEMENTING THE INVENTION

This invention has an object to present a semiconductor wafer conveying tool which can realize uniform heating to a surface of a semiconductor wafer when heating the semiconductor wafer.

Figure 1:
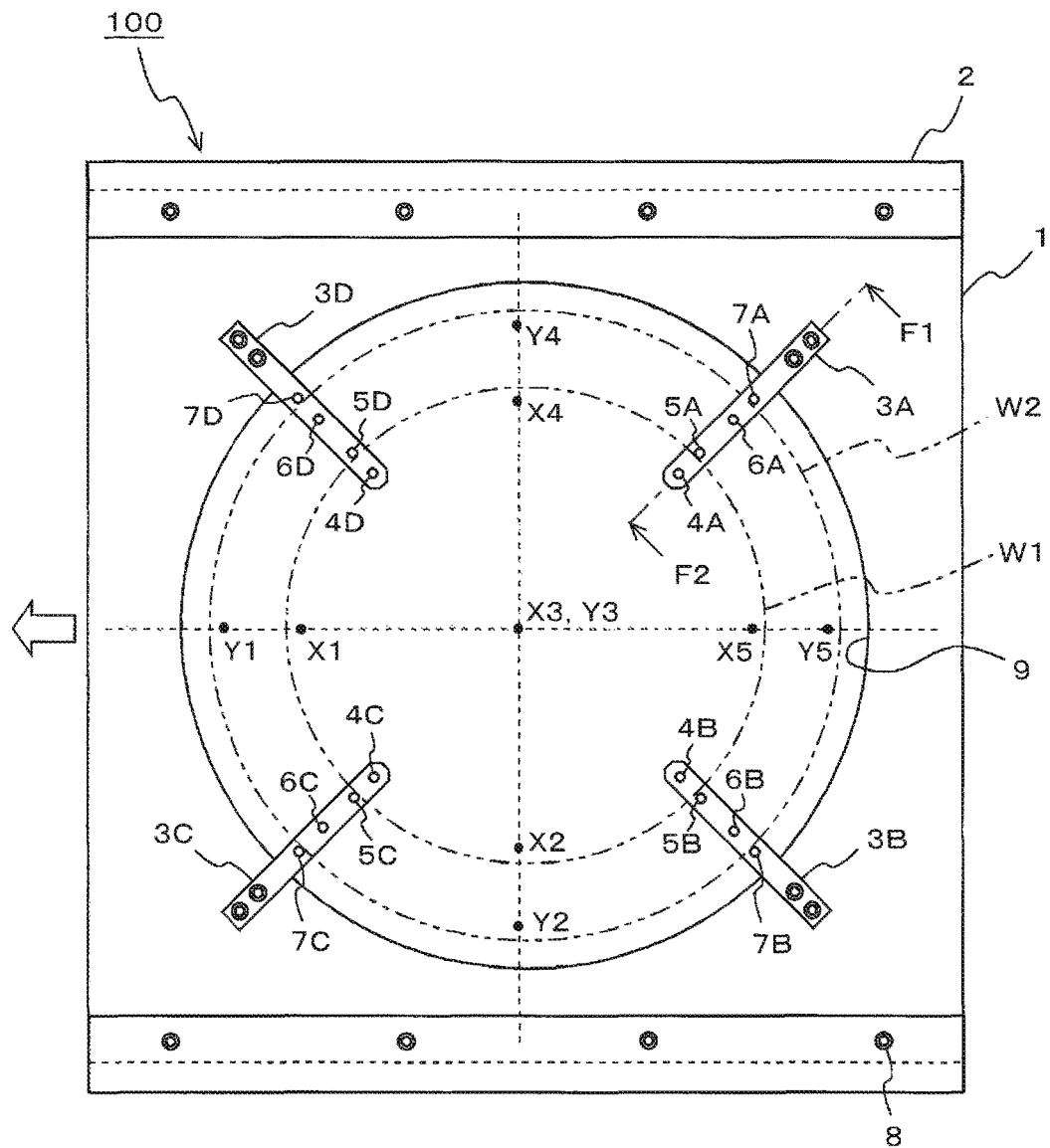
FIG. 1 is a top plan view of a wafer conveying tool 100 according to an embodiment of the invention for showing a configuration example thereof.
Figure 2:
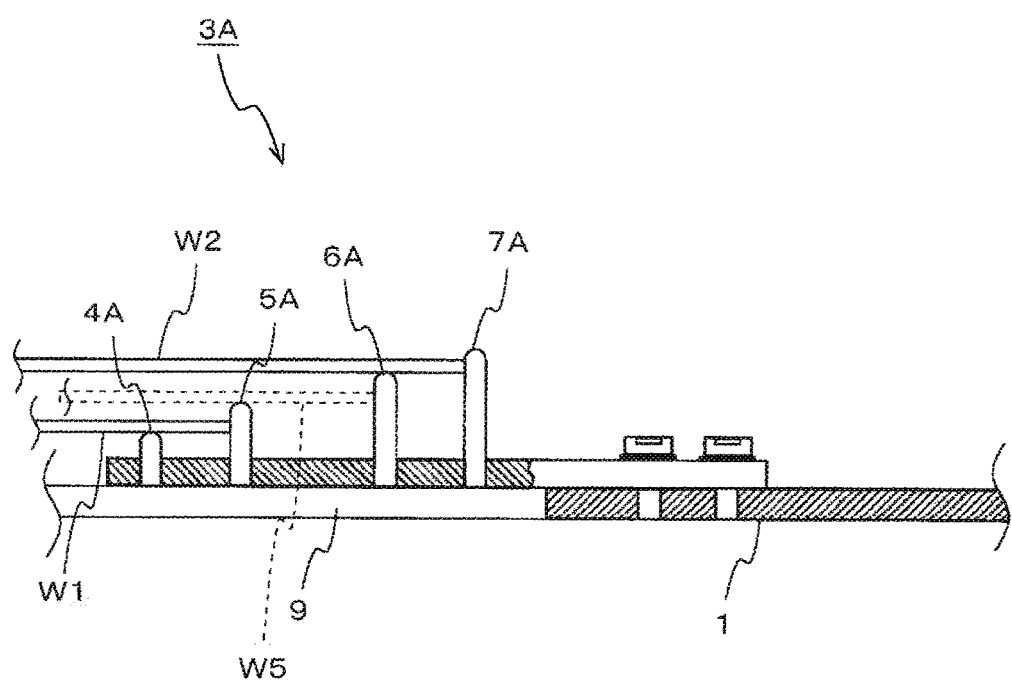
FIG. 2 is an enlarged sectional view thereof, taken along the arrow lines F1-F2 in FIG. 1.

The following will describe embodiments of the invention with reference to the attached drawings. FIG. 1 is a top plan view of a semiconductor wafer conveying tool according to an embodiment of the invention and FIG. 2 is an enlarged sectional view thereof, taken along the arrow lines F1-F2 in FIG. 1, showing shape examples of holding pins and guides for preventing misalignment (hereinafter, referred to as "prevention guides").

Namely, the wafer conveying tool 100 according to the embodiment constitutes an example of the semiconductor wafer conveying tool and is a tool that holds a semiconductor wafer to convey the same in the semiconductor manufacturing process. In a center of a base plate 1 as an example of a main body, an opening 9 is present and conveying guides 2 are respectively attached to both of the right and left sides of the base plate 1 along a conveying direction shown in an arrow by bolts 8 and the like. Supporting plates, four supporting plates (3A through 3D) in this embodiment, are arranged on the base plate 1 directing to the opening 9. The supporting plates 3A and 3C and the supporting plates 3B and 3D respectively constitute examples of supporting members and are arranged on diagonal lines, namely, the supporting plates 3A through 3D are arranged almost radially from the center of the opening 9 in the embodiment shown in FIG. 1. It is configured that the supporting plates 3A through 3D are respectively fixed onto the base plate 1 by the bolts and the like.

Anodized aluminum is suitable for the base plate 1.

The holding pins 4A through 4D or the holding pins 6A through 6D for holding a wafer having a diameter of 200 mm or a wafer having a diameter of 300 mm at their respective predetermined positions and the prevention guides 5A through 5D and the prevention guides 7A through 7D are arranged on each of the supporting plates 3A through 3D one by one. The holding pins 4A through 4D and the holding pins 6A through 6D hold the wafer from below in the opening 9. The prevention guides 5A through 5D and the prevention guides 7A through 7D prevent misalignment of the wafer during the conveying time. The holding pins 4A through 4D, the prevention guides 5A through 5D, the holding pins 6A through 6D and the prevention guides 7A through 7D are concentrically positioned when the supporting plates 3A through 3D are installed to the base plate 1. An arranged order of respective holding pins and guides is such that they are arranged in order starting from the center of the opening 9. Heights of the pins and guides are configured so that the further they are apart from the center of the opening 9, they are gradually taller (Height of 4A<Height of 5A<Height of 6A<Height of 7A).

It is to be noted that in this embodiment, the holding pins 4A through 4D and the holding pins 6A through 6D as well as the prevention guides 5A through 5D and the prevention guides 7A through 7D are respectively pushed into the supporting plates 3A through 3D. Each of the supporting plates 3A through 3D is provided on the base plate 1 on a straight line directing to the center of the opening 9 and constitutes a holding mechanism for holding the semiconductor wafer concentrically at their positions projected from an inner periphery portion of the base plate around the opening 9.

The supporting plates 3A through 3D may be made of aluminum like the base plate 1. Since, however, the aluminum is metal that is easy to charge, there is a problem such that the wafer is damaged by charged static electricity if it is under normal condition thereof. Accordingly, as the measure, it is necessary to use any aluminum on which any surface treatment is performed to prevent the charge, which results in an increase in the costs. Therefore, the supporting plate is preferably made of SUS so that it is hard to generate any charged static electricity under normal condition thereof.

Figure 1A:
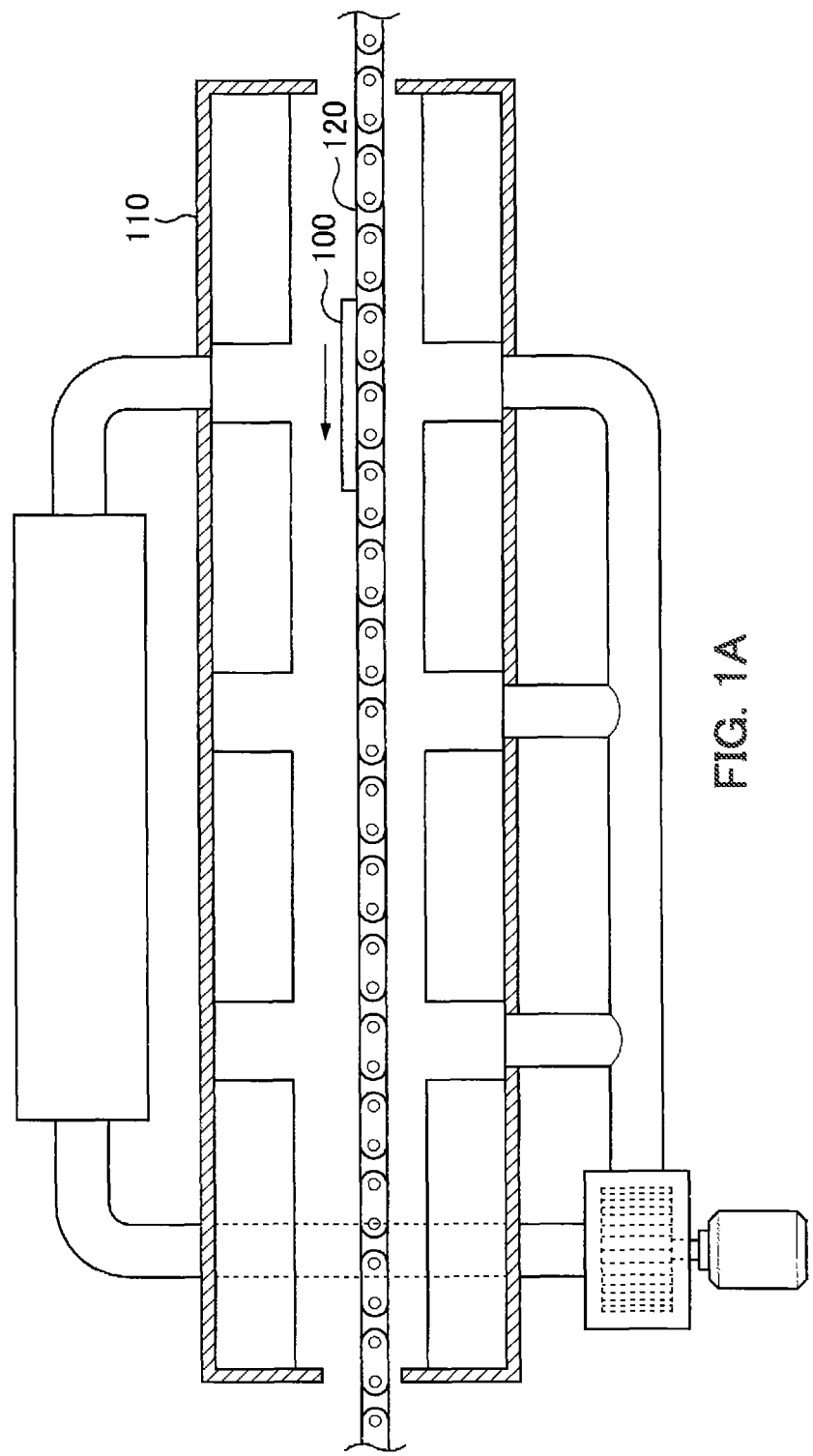
FIG. 1A is a simplified sectional view of a reflow furnace through which the wafer conveying tool 100 shown in FIG. 1 is being conveyed.

As shown in FIG. 1A, the semiconductor wafer conveying tool 100 may be used to carry a semiconductor wafer through a reflow furnace 110, shown in simplified fashion, with the semiconductor wafer conveying tool 100 carried on a conveying device 120 associated with the reflow furnace 110, allowing the reflow furnace to heat the semiconductor wafer.

Figure 3:
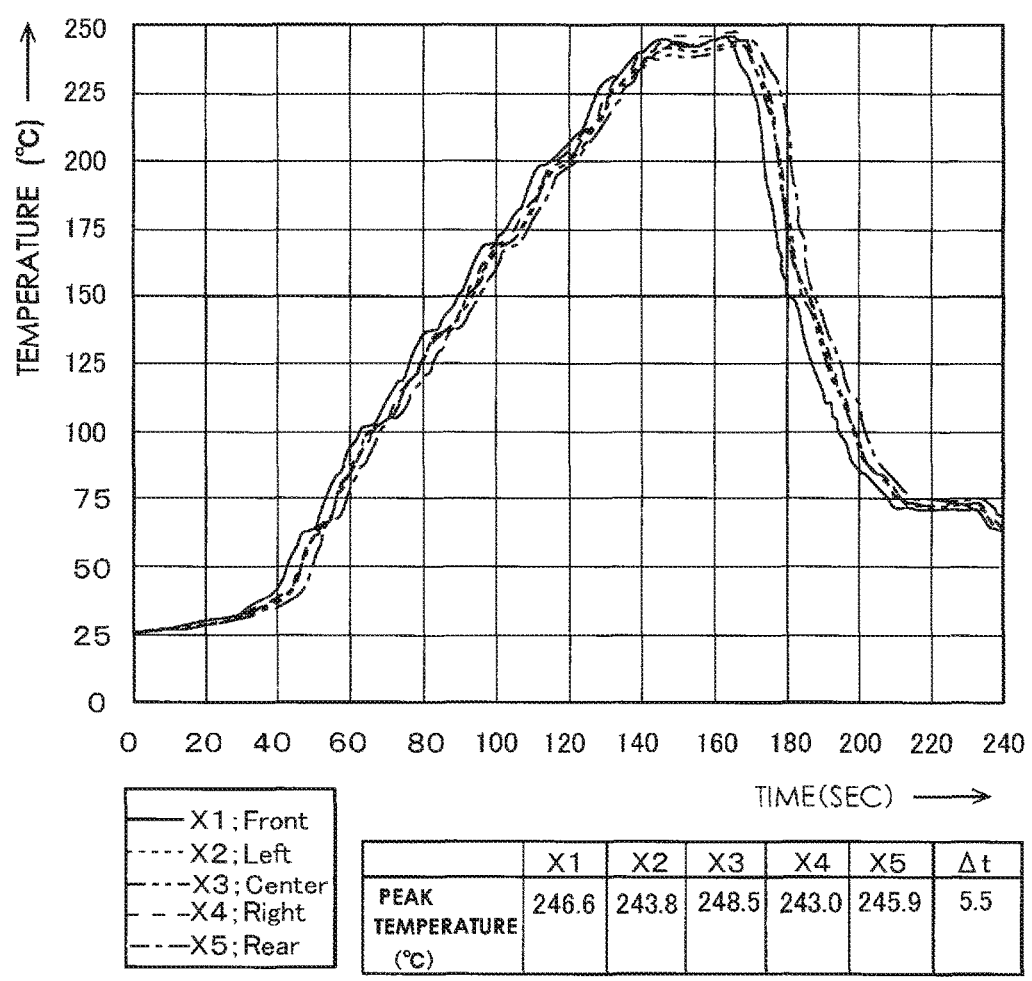
FIG. 3 is a temperature profile of a wafer having a diameter of 200 mm, which is heated using this invention.

The graph shown in FIG. 3 is a temperature profile of the wafer having a diameter of 200 mm which is heated using this invention. With reference to this temperature profile, the conveying tool of this invention shown in FIG. 1 was used and a jig for measuring the temperature profile, not shown, which had a size corresponding to that of the wafer W1 having the diameter of 200 mm was used. Thermocouple thermometers were installed at five portions, namely, a center of the jig (X3) and four front and rear, left and right portions (X1 was a front portion; X5 was a rear portion; X2 was a left portion; and X4 was a right portion) of the jig, which were away from the outer circumference of the jig by 10 mm. Under a general condition, a reflow heating was performed with the wafer being conveyed at 1.3 m/min toward an arrow direction and a variation in the surface temperature of the wafer was measured at every heating time.

Figure 4:
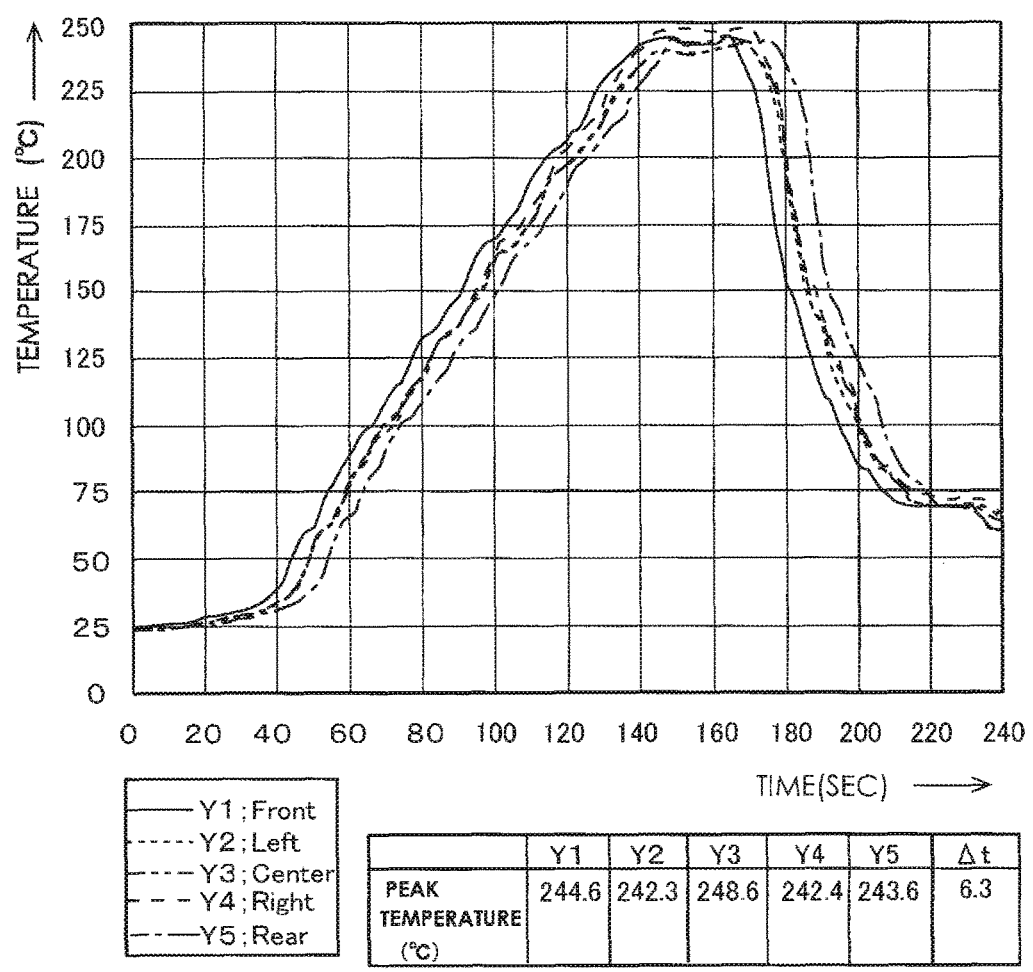
FIG. 4 is a temperature profile of a wafer having a diameter of 300 mm, which is heated using this invention.

The graph shown in FIG. 4 is a temperature profile of the wafer having a diameter of 300 mm which is heated using this invention. With reference to this temperature profile, the conveying tool of this invention shown in FIG. 1 was used and a jig for measuring the temperature profile, not shown, which had a size corresponding to that of the wafer W2 having the diameter of 300 mm was used. Thermocouple thermometers were installed at five portions, namely, a center of the jig (Y3) and four front and rear, left and right portions (Y1 was a front portion; Y5 was a rear portion; Y2 was a left portion; and Y4 was a right portion) of the jig, which were away from the outer circumference of the jig by 15 mm. Under a condition in which other conditions are the same as those shown in FIG. 3, a reflow heating was performed and a variation in the surface temperature of the wafer was measured at every heating time.

Figure 5:
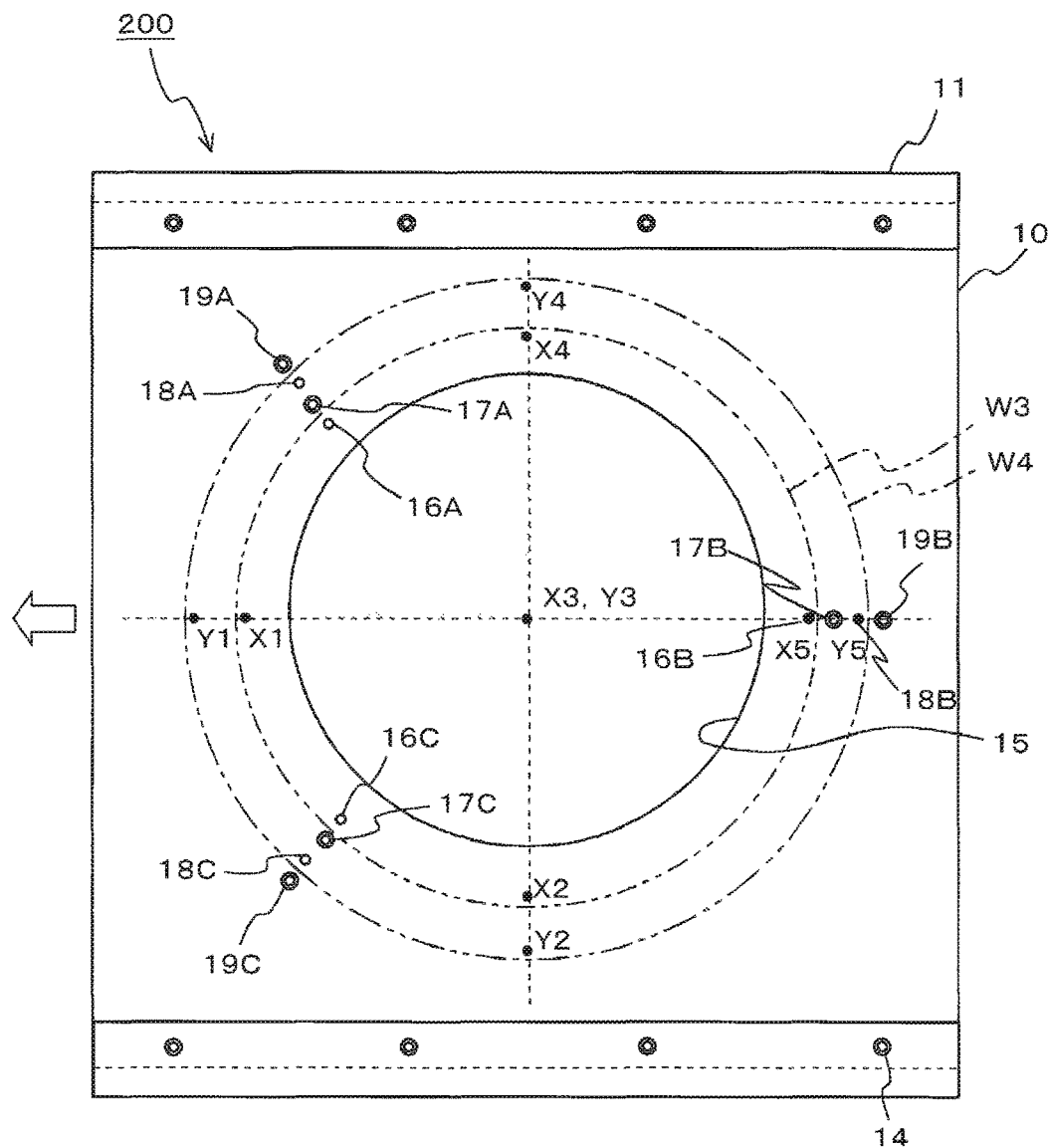
FIG. 5 is a top plan view of a conventional wafer conveying tool 200 for showing a configuration example thereof.
Figure 6:
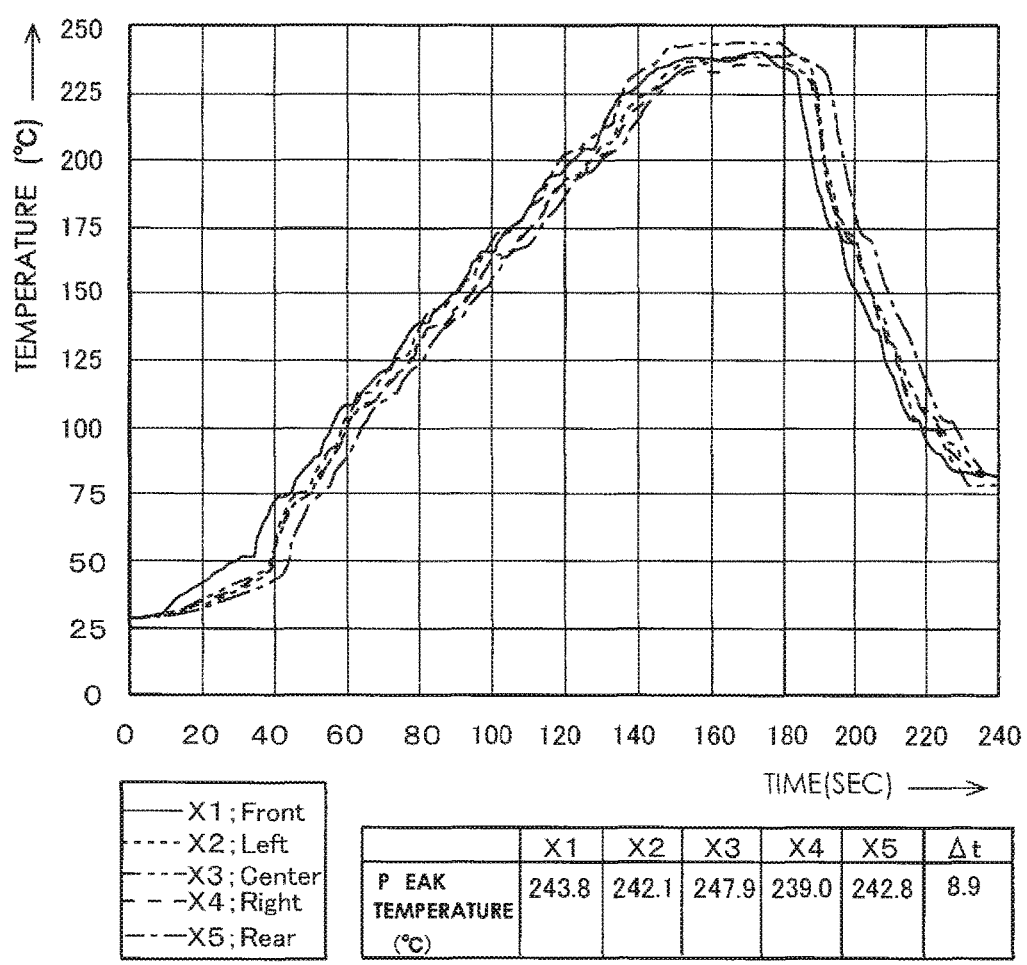
FIG. 6 is a temperature profile of a wafer having a diameter of 200 mm, which is heated using the conventional jig.
Figure 7:
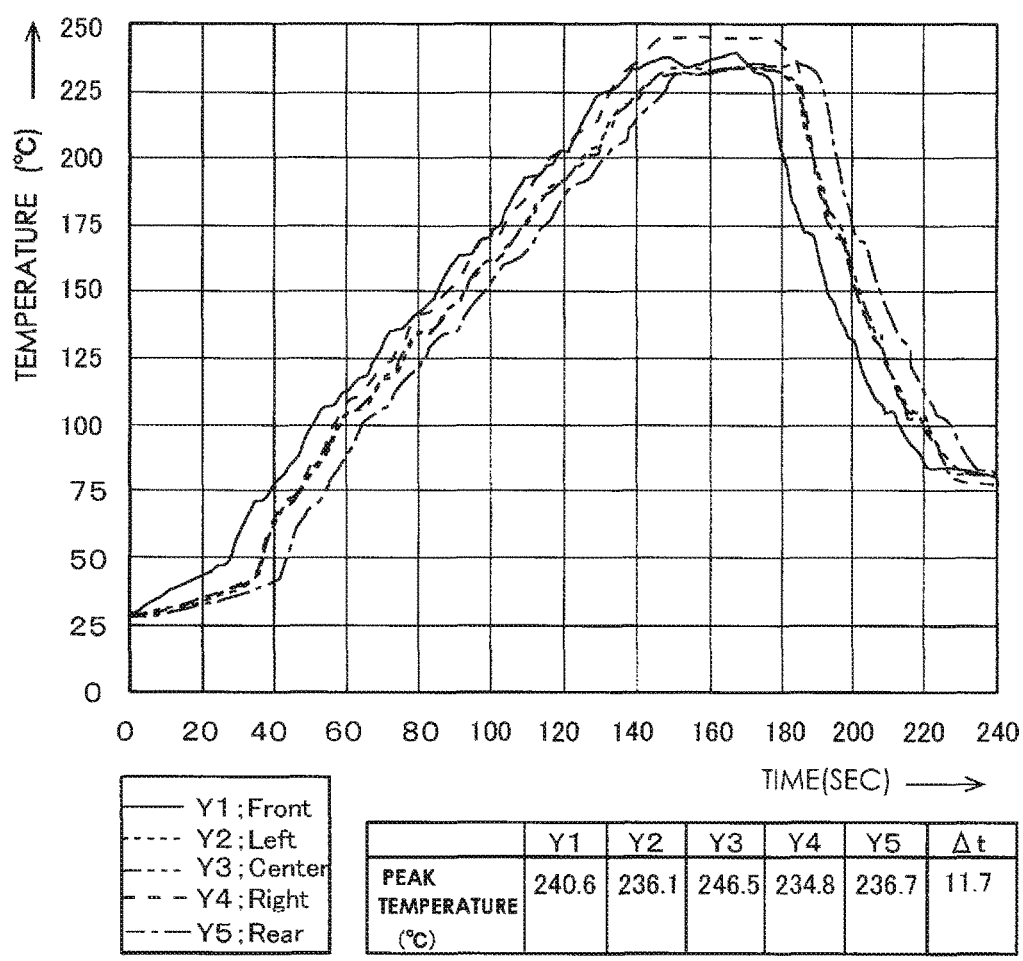
FIG. 7 is a temperature profile of a wafer having a diameter of 300 mm, which is heated using the conventional jig.

FIGS. 6 and 7 are tables when measuring variations in the surface temperature of the jigs for measuring the temperature profile at every heating time under the same conditions as those shown in FIGS. 3 and 4, respectively, using the conventional conveying tool shown in FIG. 5, in order to contrast.

The following will compare the differences ($\Delta t$) in peak temperatures of portions X1 through X5, measured using the jig for measuring the temperature profile having the size corresponding to the wafer with 200 mm.

In a case of the conventional conveying tool shown in FIG. 6, a difference ($\Delta t=8.9°$ C.) occurs in temperature (Temperature 247.9° C. of the center portion X3, the peak temperature of which is highest minus temperature 239.0° C. of the portion X4, the peak temperature of which is lowest).

On the other hand, in a case of the conveying tool of the invention shown in FIG. 3, only a difference ($\Delta t=5.5°$ C.) occurs in temperature (Temperature 248.5° C. of the center portion X3, the peak temperature of which is highest minus temperature 243.0° C. of the portion X4, the peak temperature of which is lowest).

Similarly, the following will also compare the differences ($\Delta t$) in peak temperatures of portions Y1 through Y5, measured using the jig for measuring the temperature profile having the size corresponding to the wafer with 300 mm.

In a case of the conventional conveying tool shown in FIG. 7, a difference ($\Delta t=11.7°$ C.) occurs in temperature (Temperature 246.5° C. of the center portion Y3, the peak temperature of which is highest minus temperature 234.8° C. of the portion Y4, the peak temperature of which is lowest).

On the other hand, in a case of the conveying tool of the invention shown in FIG. 4, only a difference ($\Delta t=6.3°$ C.) occurs in temperature (Temperature 248.6° C. of the center portion Y3, the peak temperature of which is highest minus temperature 242.3° C. of the portion Y2, the peak temperature of which is lowest).

As described above, when comparing the differences in the peak temperatures at every portions of the wafer surface between the embodiments of the invention and the conventional examples, the maximum difference of 2.8° C. occurs in temperature (8.3 minus 5.5) in the wafer with 200 mm. The maximum difference of 5.4° C. occurs in temperature (11.7 minus 6.3) in the wafer with 300 mm. This indicates that a sufficient effect of the invention is shown.

Although four supporting plates 3A through 3D have been set in the embodiment shown in FIG. 1, the numbers thereof is not limited to four: Any number of the supporting plates, if they are not less than three, may be set to prevent the wafer from dropping from the conveying tool.

Although one prevention guide has been set for one holding (supporting) pin in the embodiment shown in FIG. 1, the invention is not limited thereto. As shown in FIG. 2, for example, a pattern may be used so as to be suitably changed so that the prevention guide 5A supports the wafer W5 and the holding pin 6A is used as the guide for preventing misalignment of the wafer.

Further, a case where the bolts and the like fix the supporting plates 3A through 3D on the base plate 1 has been described. The invention, however, is not limited thereto: The supporting plates 3A through 3D may be configured so as to be slidable on the base plate 1. In this case, long straight slots are provided in the base plate 1 so that they extend directing to the center of the opening 9 and the supporting plates 3A through 3D may be respectively slid along the slots. This enables to be configured a position adjustment mechanism that can adjust the positions of the supporting plates 3A through 3D finely to the base plate 1.

Further, although a case where each of the supporting plates is provided on a straight line on the main body directing to the center of the opening, namely, they are radially set from the center of the opening has been described in the embodiment, the supporting plates may be configured so as to support the semiconductor wafer concentrically: The supporting plates are not always required to be set directing to the center of the opening or to be radially set from the center of the opening, if it has a configuration to attain this object.

INDUSTRIAL AVAILABILITY

The invention is preferably applicable to a semiconductor wafer conveying tool which uniformly heats a surface of the wafer when heating the wafer in a reflow furnace or the like.

DESCRIPTION OF CODES

1; Base Plate,
2; Conveying Guides,
3A through 3D; Supporting Plates,
4A through 3D; Holding Pins,
5A through 5D; Prevention Guides,
6A through 6D; Holding Pins,
7A through 7D; Prevention Guides,
8; Bolts,
9; Opening,
10; Base Plate,
11; Conveying Guides,
14; Bolts,
15; Opening,
16A through 16D; Holding Pins,
17A through 17D; Prevention guides,
18A through 18D; Holding Pins,
19A through 19D; Prevention guides,
100; Conveying tool,
200; Conveying tool, and
W1 through W5; Wafers.

The invention claimed is:

1. A semiconductor wafer conveying tool which can hold a semiconductor wafer having a predetermined diameter to convey it when heating the semiconductor wafer, characterized in that the tool comprises:
   a main body configured to convey the semiconductor wafer while heating the semiconductor wafer in a reflow furnace, the main body defining an enclosed opening having a center and a diameter which is larger than the diameter of the largest semiconductor wafer intended to be conveyed;
   at least three supporting members made of stainless steel, the supporting members being fixed to the main body and stationary at positions around the opening and projecting generally radially inwardly with respect to the opening and toward the center of the opening, each of the supporting members including a supporting plate having a predetermined length and a plurality of pins mounted on the supporting plate, the plurality of pins mounted on the supporting plate having respective locations corresponding to the diameter of the semiconductor wafer and including a holding pin located on the supporting plate for supporting the semiconductor wafer from below and a guide pin located on the supporting plate for preventing misalignment of the wafer, the guide pin being taller than the holding pin and being located on the supporting plate at a greater distance from the center of the opening than a location of the holding pin on the supporting plate;
   wherein the enclosed opening is located below the supporting members; and
   wherein the supporting members constitute a holding mechanism arranged to support the semiconductor wafer in a location that is concentric with the opening, with the semiconductor wafer supported by the holding pins and kept in alignment by the guide pins.

2. The semiconductor wafer conveying tool according to claim 1 characterized further in that the pins mounted on the supporting plates have at least two species of heights, that for each of the at least two species, respective pins belonging to the respective species are located on the supporting plates of at least three of the supporting members and at an equal distance from the center, and in that the pins located on each supporting plate are arranged along the respective supporting plate so that their heights are successively taller in order from a position nearer to the center of the opening of the main body toward an outside of the opening.

3. A semiconductor wafer conveying tool which can hold a semiconductor wafer having one of a plurality of predetermined diameters, to convey the semiconductor wafer while heating it, characterized in that the tool comprises:
   a main body configured to convey the semiconductor wafer within a reflow furnace while the reflow furnace heats the semiconductor wafer, the main body defining an enclosed opening having a center and a diameter that is larger than the largest one of the predetermined diameters of the semiconductor wafer;
   at least three supporting members made of stainless steel, the supporting members being fixed and stationary with respect to the main body at respective positions around the opening, each of the supporting members projecting generally radially inwardly with respect to the opening and toward the center of the opening, and each of the supporting members including a supporting plate having a predetermined length and a plurality of pins mounted on the supporting plate, each of the plurality of pins mounted on the supporting plate having a location corresponding to a respective one of the predetermined diameters of a semiconductor wafer, and the plurality of pins including a holding pin located on the supporting plate to support the semiconductor wafer from below, and a guide pin located on the supporting plate, the guide pin being taller than the holding pin and being located on the supporting plate at a greater distance from the center of the opening than a location of the holding pin on the supporting plate, where the guide pin can extend upward alongside the semiconductor wafer and thereby prevent misalignment of the wafer with respect to the main body;
   wherein the enclosed opening is located below the supporting members; and
   wherein the supporting members constitute a holding mechanism arranged to support the semiconductor wafer in a location that is concentric with the opening, with the semiconductor wafer supported by the holding pins and kept in alignment by the guide pins.

* * * * *